US006786279B2

(12) United States Patent
Hasenoehrl et al.

(10) Patent No.: US 6,786,279 B2
(45) Date of Patent: Sep. 7, 2004

(54) FORWARD IN FLIGHT (IFE) ENTERTAINMENT COOLING SYSTEM

(75) Inventors: Thomas R. Hasenoehrl, Stanwood, WA (US); Charles E. Kusuda, Mukilteo, WA (US); Quy Lam, Mukilteo, WA (US)

(73) Assignee: The Boeing Company, Chicago, IL (US)

( * ) Notice: Subject to any disclaimer, the term of this patent is extended or adjusted under 35 U.S.C. 154(b) by 36 days.

(21) Appl. No.: 09/852,423

(22) Filed: May 9, 2001

(65) Prior Publication Data

US 2001/0042612 A1 Nov. 22, 2001

Related U.S. Application Data

(60) Provisional application No. 60/205,626, filed on May 18, 2000.

(51) Int. Cl.[7] ........................... B64D 13/04; B64D 13/08
(52) U.S. Cl. ........................ 165/235; 454/76; 165/80.3; 165/41; 244/117 R
(58) Field of Search ........................... 165/41, 202, 235; 165/80.3; 454/76; 244/117 R

(56) References Cited

U.S. PATENT DOCUMENTS

| 2,884,845 A | 5/1959 | Beggs |
| 2,930,553 A | 3/1960 | Greenough |
| 3,825,212 A | 7/1974 | Darges et al. |
| 4,394,861 A | 7/1983 | Sciortino |
| 4,739,823 A | * 4/1988 | Howard .................. 165/41 X |
| 4,934,154 A | 6/1990 | Altoz et al. |
| 5,474,120 A | 12/1995 | Severson et al. |
| 5,894,987 A | 4/1999 | Layne et al. |

FOREIGN PATENT DOCUMENTS

| DE | 38 24 471 A | 2/1990 |
| EP | 0 278 717 A | 8/1988 |
| EP | 0 738 655 A | 10/1996 |

* cited by examiner

Primary Examiner—Ljiljana Ciric

(57) ABSTRACT

A forward in flight entertainment system (IFE) which allows air to be directed to and exhausted from the IFE equipment in isolation from the cabin conditioned air. Further, potential IFE generated smoke may be kept isolated from the cabin air. The forward IFE equipment is located in forward sections of the aircraft system switching from ground to air mode is accomplished through air/ground signal 10 responsive to landing gear truck tilt. Once the air/ground transition from ground mode to air mode has occurred, ventilation valves 1 and 2 will be closed and the heated air will be exhausted overboard by forward IFE cooling overboard valve 4 whose overboard flow increases with altitude and cabin to ambient pressure differential.

12 Claims, 3 Drawing Sheets

Fig. 3

| IFE COOLING SYS CONTROLLER (36) INPUTS | | | IFE COOLING SYS CONTROLLER (36) OUTPUTS → | AIR/GROUND SENSOR (10) | IFE COOLING OVERBOARD EXHAUST VALVE (1) | IFE COOLING OVERBOARD EXHAUST VALVE (2) | IFE COOLING INBOARD EXHAUST VALVE (3) | IFE COOLING FLIGHT EXHAUST VALVE (4) | IFE COOLING EXHAUST FAN (6) | IFE COOLING SUPPLY FAN (7) |
|---|---|---|---|---|---|---|---|---|---|---|
| MASTER IFE SYSTEM POWER (16) OFF | | | | | | | | | | |
| MASTER IFE SYSTEM POWER (16) ON | NORMAL OPERATION MODES | OAT (14) T < 45° | | AIR MODE | CLOSED | CLOSED | OPENED | OPENED | OFF | OFF |
| | | | | GND MODE | OPENED | OPENED | CLOSED | CLOSED | OFF | OFF |
| | | OAT (14) T > 45° | | AIR MODE | CLOSED | CLOSED | OPENED | OPENED | ON | ON |
| | | | | GND MODE | CLOSED | CLOSED | OPENED | OPENED | ON | ON |
| | OVERRIDE OPERATION MODES | SMOKE DETECTOR INDICATING SMOKE (5) | | AIR MODE | CLOSED | CLOSED | OPENED | OPENED | ON | OFF |
| | | | | GND MODE | OPENED | OPENED | CLOSED | CLOSED | OFF | OFF |
| | | NO FRESH AIR (24) | | AIR MODE | CLOSED | CLOSED | OPENED | CLOSED | OFF | OFF |
| | | | | GND MODE | OPENED | OPENED | CLOSED | CLOSED | OFF | OFF |
| | | FIRE SYSTEM ARMED (12) | | AIR MODE | CLOSED | CLOSED | OPENED | CLOSED | ON | ON |
| | | | | GND MODE | OPENED | OPENED | CLOSED | CLOSED | OFF | OFF |
| | | ADDITIONAL OVERBOARD EXHAUST FLOW (18) | | AIR MODE | CLOSED | CLOSED | OPENED | CLOSED | ON | ON |
| | | REDUCED RECIRC. AIR (20) | REDUCED FRESH AIR (22) | | | | | | | |
| | | OFF | ON | AIR MODE | CLOSED | CLOSED | OPENED | OPENED | ON | ON |
| | | ON | OFF | AIR MODE | CLOSED | CLOSED | OPENED | CLOSED | ON | ON |
| | | ON | ON | AIR MODE | CLOSED | CLOSED | CLOSED | CLOSED | OFF | OFF |

FORWARD IN FLIGHT (IFE) ENTERTAINMENT COOLING SYSTEM

CROSS-REFERENCE TO RELATED APPLICATIONS

This application claims the benefit of U.S. Provisional Application 60/205,626 filed May 18, 2000.

FIELD OF THE INVENTION

This invention relates to aircraft air conditioning systems, and more particularly to a cooling system for in flight entertainment system electronics.

BACKGROUND OF THE INVENTION

Many systems are available for providing audio and video entertainment as well as telecommunications to airline passengers. Much of the innovation has concerned the enablement of higher fidelity systems to increase their appeal to passengers so that airborne systems compare with familiar ground entertainment systems. However the rapid proliferation of these electronic devices has added a significant burden to the host aircraft's power generation and air conditioning systems.

Thermal management of (IFE) electronics is essential to maximizing the life of the electronics and preserving the quality of the aircraft cabin air conditioning.

Prior Art

The prior art patent literature includes U.S. Pat. No. 5,894,987 to Layne et. al. which discloses a ram air for cooling a heat generating component. Air is introduced through the air inlet and exhausted through an outlet. The component may be an electrical component, engine or engine part.

U.S. Pat. No. 5,474,120 to Severson et. al. shows the use of cool air to regulate the heat of electronics. The system has a primary and secondary source of cool air.

U.S. Pat. No. 3,930,553 to Greenough shows an aircraft cooling system having separate heat exchangers for the pilot and accessories. The accessory heat exchanger operates at higher temperatures than would otherwise be comfortable for occupants of an aircraft.

U.S. Pat. No. 2,825,212 to Darges et. al. discloses an aircraft heating and ventilating system which uses outside air having a duct. The temperature of the air is regulated by a controller.

U.S. Pat. No. 4,394,861 to Scortino is illustrative of a system for ducting outside air directly to a face mask. The outside air is used for breathing when the inside of the aircraft has become contaminated.

SUMMARY OF THE INVENTION

It is an object of the present invention to satisfy the equipment cooling requirements of central command equipment of the (IFE) system.

It is another object of the present invention to provide a cooling system necessary to manage the heat dissipated by the same equipment so that the airplane cabin environment will still be comfortable to passengers and crew.

Accordingly there is provided a dedicated (IFE) electronics cooling system for extending the service life of the passenger entertainment system electronics and preserving the quality of the host aircraft's passenger air conditioning system.

DETAILED DESCRIPTION OF THE PREFERRED EMBODIMENT

Figure 1:
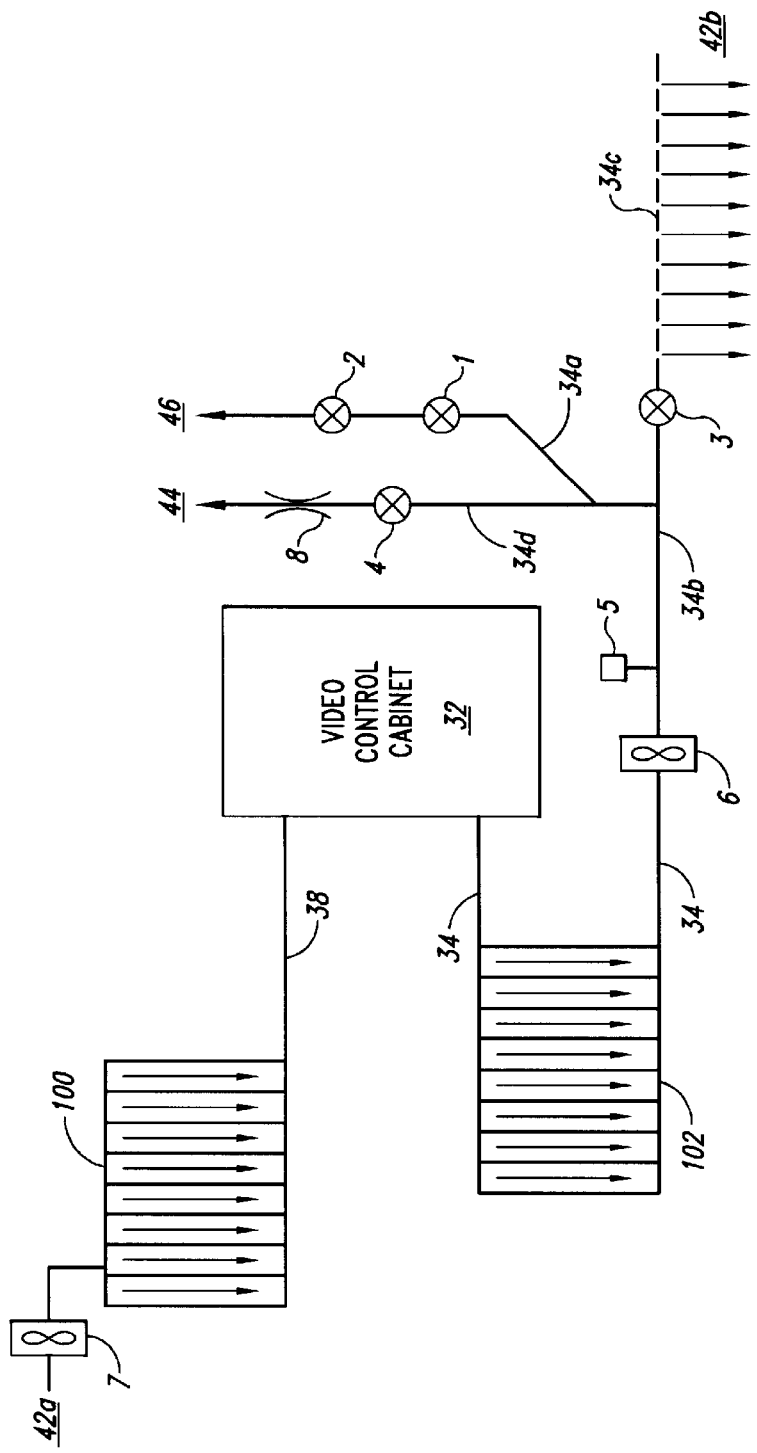
FIG. 1. is a simplified block diagram of air flow in the present forward (IFE) equipment cooling system.
Figure 2:
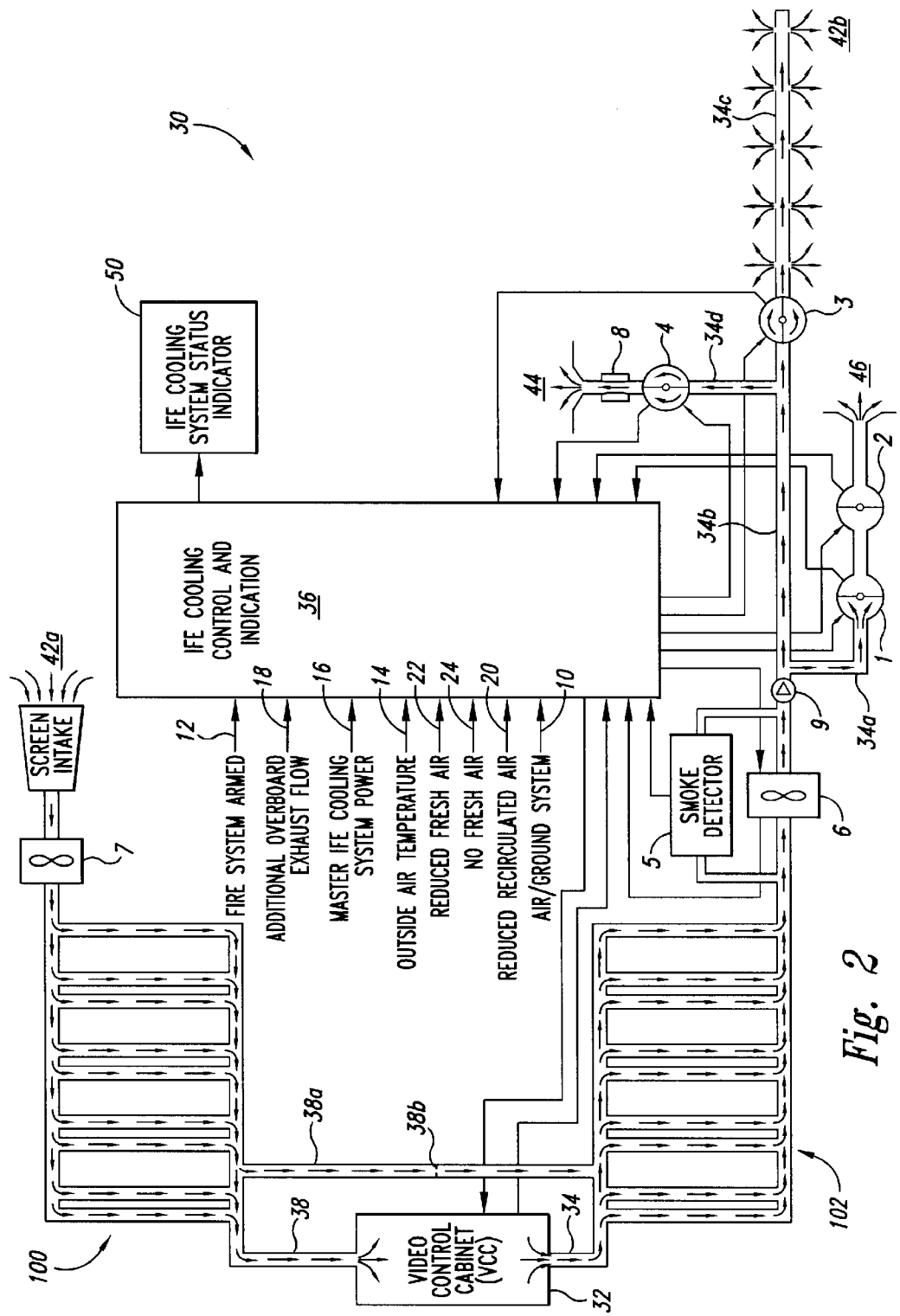
FIG. 2. is a schematic representation of the present forward in flight entertainment cooling system; and, FIG. 3. is illustrative of the valve control logic in the control means of the forward in flight entertainment equipment cooling system of FIG. 2.

Turning now to FIG. 1 illustrative of the valves controlling air flow in the system of FIG. 2 it should be noted that the conditions for valve control in response to input signals are shown in FIG. 3.

The large forward in flight entertainment cooling system, hereinafter called IFE shown in FIG 2. has a maximum capacity of −650 cubic feet per minute (cfm). Supply air 42(a) is from forward of the cargo door. Forward supply fan 7 is installed in the supply manifold forward of the cargo door. The air is forced up by supply fan 7 through the supply manifold (100), which comprises nine 2.25-inch diameter flex ducts running between frames and windows.

Once the cooling air is run through the video control cabinet (hereinafter called VCC) (32) equipment, it is drawn up into the exhaust duct (34). The exhaust duct (34) is equipped to collect exhaust air from any of the VCC locations, and is also connected directly to the distribution duct 38(a), 38(b) that bypasses the VCC (32). This exhaust system is comprised of a collection manifold 102, forward exhaust fan 6, forward smoke detector 5 plumbed across forward exhaust fan 6, followed by branches to overboard 34(a) and mix bay 46. Branch 34 to overboard splits into ground exhaust branch 34(a) and an in flight exhaust 34(b). Ground exhaust system 34(a) has two shutoff valves, forward primary ventilation valve 1 and forward secondary ventilation valve 2 connected in series prior to a split in ducting leading to two 3.25 inch diameter skin penetrations. Both inflight 34(b) and ground outboard 34(a) branches are located in the forward lower lobe of the aircraft. In flight exhaust branch 34(b) has a single shutoff valve. Inboard exhaust branch 34(b) to mix bay 34(c) has a single shutoff valve 3. Control of the system through a programmable integrated circuit is accomplished by a printed circuit card assembly comprising control means 36 governed by the logic shown in FIG 3.

During ground operations with the outside ambient temperature (OAT) greater than 45 degrees F., the IFE cooling system will exhaust heated air outside of the aircraft through both ventilation valves. Both ventilation valves 1 and 2 in ground overboard branch 34(a), therefore are fully open, and forward shutoff valve 3 in the branch dumping inboard is closed while the aircraft is on the ground. If the aircraft is on the ground an the OAT is less than 45 degrees F., the cooling system will exhaust the heated air into mix bay 34(c) and close ventilation valves 1 and 2 of the aircraft for preventing cold outside air from being drawn in from aircraft outflow valve 42(b). In this scenario in a cold winter day, the heated air would be utilized to maintain warm temperature within the aircraft.

System switching from ground to air mode is accomplished through air/ground signal 10 responsive to landing gear truck tilt. Once the air/ground transition from ground mode to air mode has occurred, ventilation valves 1 and 2 will be closed and the heated air will be exhausted overboard by forward IFE cooling overboard valve 4 whose overboard flow increases with altitude and cabin to ambient pressure differential. Some heated air will continue to be exhausted through forward inboard shutoff valve 3 until the aircraft reaches cruise altitude. Forward IFE cooling overboard valve 4 is closed only if one or more of the following conditions occur: 1) on the ground, or 2) if the electrical/electronic cooling mode is in the override mode, or 3) when the fire system is armed through input of signal 12, or 4) when aircraft pressurization is a concern. At all other times forward IFE cooling overboard valve 4 is open, allowing the venturi to draw up to 650 cfm overboard. This allows for the removal of VCC head end heat from the aircraft and provides necessary pressure differential to ventilate the VCC during smoke mode. With forward IFE cooling overboard valve 4 closed, and the IFE system operating, the heated air from the VCC will be blown inward to the mix bay.

If smoke is detected in the present forward IFE cooling system during flight, all valves except forward IFE cooling overboard valve 4 will close to contain smoke, and all fans will be powered off.

Although this invention has been illustrated and described in connection with the particular embodiment illustrated, it will be apparent to those skilled in the art that various changes may be made therein without departing from the spirit of the invention as set forth in the appended claims.

What is claimed is:

1. In combination with in an aircraft:
   an in-flight entertainment system having in-flight entertainment system electronics;
   a video control cabinet for housing said in-flight entertainment system electronics;
   a cooling system for conducting air from outside the aircraft cabin to said video control cabinet; and,
   control means for venting healed air from said video control cabinet to the outside of the aircraft or to said aircraft cabin depending upon the location of the aircraft and the outside ambient temperature.

2. The invention according to claim 1 wherein said control means exhausts the heated air outside the aircraft when the aircraft is on the ground and the outside ambient temperature (OAT) is greater than 45 degrees F.

3. The invention according to claim 1 wherein said control means vents said heated air into the aircraft cabin when the aircraft is on the ground and the outside ambient temperature (OAT) is less than 45 degrees F.

4. The invention according to claim 1 wherein said video control cabinet is for use in the forward section of an aircraft.

5. In combination with in an aircraft:
   an in flight entertainment system having in-flight entertainment system electronics;
   a video control cabinet for housing said in flight entertainment system electronics;
   a cooling system for conducting air from outside the aircraft cabin to said video control cabinet;
   control means for venting heated air from said video control cabinet to the outside of the aircraft or to said aircraft cabin depending upon the location of the aircraft and the outside ambient temperature; and, wherein said control means vents said heated air into the aircraft cabin when the aircraft is on the ground and the outside ambient temperature (OAT) is less than a predetermined temperature.

6. The invention according to claim 5 wherein said outside ambient temperature (OAT) is less than 45 degrees F.

7. A system within an aircraft for exhausting heated air overboard comprising:
   an air/ground signal for detecting air/ground transition from ground made to air mode;
   a forward in-flight entertainment system cooling overflow valve;
   ventilation valves for closing and exhausting heated air overboard by said forward in-flight entertainment system cooling overflow valve upon transition to air mode; and
   said forward in-flight entertainment system cooling overflow valve providing overboard flow increasing with altitude and cabin to ambient pressure differential.

8. A dedicated in-flight entertainment electronics cooling system for extending the service life of the in-flight entertainment system electronics and preserving the quality of a host aircraft passenger air conditioning system comprising:
   a plurality of valves including an overboard valve for controlling air flow in said dedicated in-flight entertainment cooling system;
   a smoke detector for detecting smoke in the flight entertainment electronics cooling system and closing said plurality of valves except said overboard valve to contain smoke.

9. In combination with an aircraft having a cargo door, frames and windows:
   a forward in-flight entertainment cooling system;
   supply air provided forward of the cargo door;
   a forward supply fan disposed in a supply manifold forward of the cargo door;
   a supply manifold comprising a plurality of flex ducts running between the frames and windows; and
   said forward supply fan providing forced air through said supply manifold.

10. An exhaust system for use in an aircraft comprising in combination:
    a plurality of video control cabinets;
    an exhaust duct for collecting exhaust air from any of said plurality of video control cabinets;
    said exhaust duct connected to a distribution duct bypassing said plurality of video control cabinets;
    said exhaust system further including a collection manifold, forward exhaust fan and forward smoke detector plumbed across said forward exhaust fan.

11. The exhaust system of claim 10 further including overboard and mix bay, branch to overboard splitting into a ground exhaust branch and an in-flight exhaust branch.

12. An in-flight entertainment cooling system in an aircraft including a system for switching from ground to air mode, said system responsive to air/ground signal, ventilation valves closed in response to ground mode to air mode providing exhaust overboard of heated air by a forward overboard valve providing overboard flow increases with altitude and cabin to ambient pressure differential.

* * * * *